(12) United States Patent
Rinehimer

(10) Patent No.: US 7,750,412 B2
(45) Date of Patent: Jul. 6, 2010

(54) RECTIFIER WITH PN CLAMP REGIONS UNDER TRENCHES

(75) Inventor: Mark Rinehimer, Mountaintop, PA (US)

(73) Assignee: Fairchild Semiconductor Corporation, South Portland, ME (US)

(*) Notice: Subject to any disclaimer, the term of this patent is extended or adjusted under 35 U.S.C. 154(b) by 0 days.

(21) Appl. No.: 12/186,743

(22) Filed: Aug. 6, 2008

(65) Prior Publication Data

US 2010/0032790 A1 Feb. 11, 2010

(51) Int. Cl.
| H01L 21/331 | (2006.01) |
| H01L 21/20 | (2006.01) |
| H01L 21/36 | (2006.01) |
| H01L 21/04 | (2006.01) |

(52) U.S. Cl. ...................... 257/371; 257/478
(58) Field of Classification Search ................. 257/371, 257/478, E29.338, E21.359
See application file for complete search history.

(56) References Cited

U.S. PATENT DOCUMENTS

| 4,982,260 A | 1/1991 | Chang et al. |
| 2005/0009295 A1* | 1/2005 | Chan et al. .................. 438/429 |
| 2008/0128850 A1* | 6/2008 | Goerlach et al. ............ 257/476 |

OTHER PUBLICATIONS

Max Chen, Henry Kuo, L.C. Kao, "The First Commercial 200-V TMBS (Trench MOS Barrier Schottky) Rectifier vs. Traditional Rectifiers in Telecom Applications," International Exhibition and Conference for Power Electronics, Intelligent Motion and Power Quality, PCIM Europe 2008, May 27-29, 2008, Nuremberg, Germany, pp. 130-134, Mesago PCIM GmbH, Stuttgart, Germany.

* cited by examiner

Primary Examiner—William M. Brewster
(74) Attorney, Agent, or Firm—Townsend and Townsend and Crew LLP

(57) ABSTRACT

A structure that includes a rectifier is formed as follows. A trench is formed in a semiconductor region of a first conductivity type. A dielectric layer is formed along opposing sidewalls of the trench but is discontinuous along the bottom of the trench. A doped liner is formed over the dielectric layer and along the bottom of the trench. The doped liner includes dopants of a second conductivity type and is in direct contact with the semiconductor region along the bottom of the trench. A portion of the dopants are diffused from the doped liner into the semiconductor region along the bottom of the trench to form a doped region. The doped region forms a PN junction with the surrounding semiconductor region.

10 Claims, 4 Drawing Sheets

RECTIFIER WITH PN CLAMP REGIONS UNDER TRENCHES

BACKGROUND OF THE INVENTION

The present invention relates in general to semiconductor technology and in particular to structures and methods for forming performance enhancing PN clamps in such semiconductor structures as trench MOS barrier Schottky (TMBS) rectifiers.

Semiconductor-based power rectifiers are well known and have been used in power electronic systems for many decades. Schottky rectifiers have generally been used in applications operating at mid to low voltages due to their low on-state voltage drop and fast switching speed. Schottky rectifiers can be optimized by changing the Schottky contact metal to alter the barrier height. There is a tradeoff, however, between forward voltage drop and reverse leakage current. As the barrier height is reduced, the forward voltage drop decreases but the reverse leakage current increases. On the other hand, as the barrier height is increased, the forward voltage drop increases but the reverse leakage current decreases.

This tradeoff between forward voltage drop and reverse leakage current can be improved using a TMBS rectifier structure. The trench MOS structure of the TMBS rectifier greatly reduces the electric field under the Schottky contact thus increasing reverse breakdown voltage and reducing reverse leakage current. This allows higher doping concentration in the mesa regions thus reducing the rectifier's on-state voltage drop.

One variant of the TMBS rectifier structure includes a PN junction formed below each trench. Like the TMBS structure described above, under reverse bias the depletion regions merge to reduce leakage current. The PN junction can also improve breakdown characteristics of the Schottky contact by clamping the reverse voltage at a lower avalanche breakdown of the PN junction. Conventional methods of forming such a structure involve implanting dopants into the semiconductor region along the bottom of the trench and thermally activating the dopants in the semiconductor region. Thermal cycles from subsequent processing steps, however, can cause excessive lateral diffusion of the implanted dopants thus limiting cell pitch.

Thus, improved structures and methods for forming PN clamps in such semiconductor structures as TMBS rectifiers are desired.

SUMMARY OF THE INVENTION

In accordance with an embodiment of the invention, a structure that includes a rectifier comprises a semiconductor region of a first conductivity type with trenches extending into the semiconductor region. A dielectric layer lines opposing sidewalls of each trench but is discontinuous along the bottom of each trench. A silicon region of a second conductivity type extends along the bottom of each trench and forms a PN junction with the semiconductor region. A doped liner lines the dielectric layer and the bottom of each trench and is in direct contact with the semiconductor region. A fill material fills each trench. An interconnect layer extends over the semiconductor region and is in direct contact with the doped liner. The interconnect layer also contacts mesa surfaces of the semiconductor region between adjacent trenches to form Schottky contacts therebetween.

In one embodiment, an oxide layer separates the doped liner from the fill material.

In another embodiment, the semiconductor region includes an epitaxial layer extending over a substrate, and the substrate has a higher doping concentration than the epitaxial layer. In some embodiments, the trenches extend into and terminate in the epitaxial layer. In other embodiments, the trenches extend through the epitaxial layer and terminate within the substrate.

In accordance with another embodiment of the invention, a structure that includes a rectifier is formed as follows. A trench is formed in a semiconductor region of a first conductivity type. A dielectric layer is formed along opposing sidewalls of the trench but is discontinuous along the bottom of the trench. A doped material is formed in the trench. The doped material includes dopants of a second conductivity type and is in direct contact with the semiconductor region along the bottom of the trench. A portion of the dopants are diffused from the doped liner into the semiconductor region along the bottom of the trench to form a doped region. The doped region forms a PN junction with the semiconductor region.

In one embodiment, the dopants are diffused into the semiconductor region by exposing the doped material to a thermal cycle.

In one embodiment, the doped material comprises polysilicon and is doped by implanting dopants of the second conductivity type into the polysilicon.

In another embodiment, the doped material comprises polysilicon and is doped in-situ with dopants of the second conductivity type.

In some embodiments, the doped material fills the entire trench. In other embodiments, a fill material fills an interior portion of the trench.

In yet another embodiment, a conductor layer is formed over the semiconductor region and is in direct contact with the doped material. The conductor layer also contacts mesa surfaces of the semiconductor region adjacent to the trench to form Schottky contacts.

The following detailed description and the accompanying drawings provide a better understanding of the nature and advantages of the present invention.

DETAILED DESCRIPTION OF THE INVENTION

Embodiments of a TMBS rectifier structure with PN junction clamps and methods of forming the same are described in accordance with the invention. A doped liner is used as the dopant source for the formation of a silicon region below each trench. Whether the liner is doped in-situ or by implant, dopants can be diffused from the doped liner into the surrounding semiconductor region with limited lateral diffusion thus allowing a narrow cell pitch. The silicon region below each trench is of an opposite conductivity type than the surrounding semiconductor region and thus forms a PN junction with the semiconductor region. The PN junction can prevent breakdown from occurring at the Schottky rectifying contact by clamping the reverse voltage at a lower avalanche breakdown of the PN junction. Also, the PN junction is in electrical contact with a conductive material (e.g., the liner) in the trench, and the avalanche current thus flows through the trench rather than through the Schottky contact.

Figure 1:
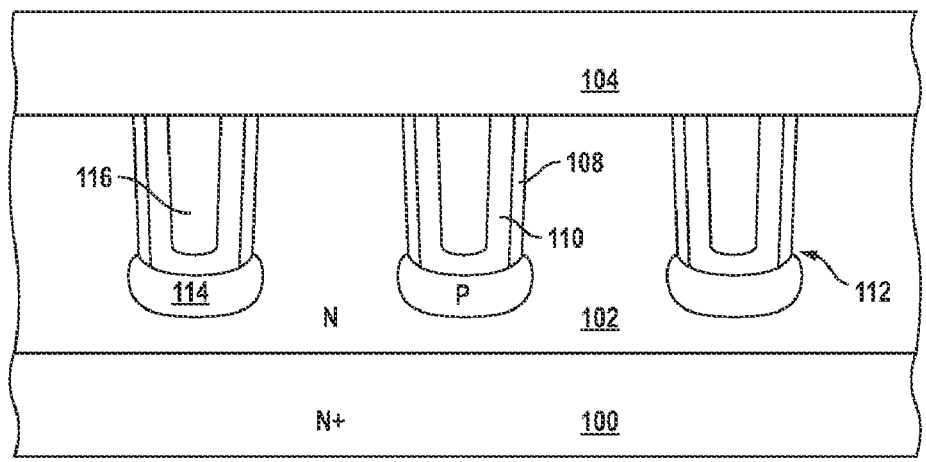
FIG. 1 shows a simplified cross-section view of a TMBS rectifier structure with PN junction clamps, in accordance with an embodiment of the invention.

FIG. 1 shows a cross-section view of a TMBS rectifier structure with a PN junction clamp below each trench, in accordance with an embodiment of the invention. An N-type semiconductor region 102 extends over an N+ type substrate 100 and includes a plurality of trenches 112. Trenches 112 extend from the top surface of semiconductor region 102 to a predetermined depth. Each trench 112 is lined with a dielectric layer 108 along its sidewalls. A doped liner 110 lines the dielectric layer and the bottom of each trench 112. A fill material 116 fills an internal portion of each trench 112. A P-type silicon region 114 extends along the bottom of each trench 112. Each P-type silicon region 114 forms a PN junction with the surrounding N-type semiconductor region 102.

Conductor 104 (e.g., a layer comprising aluminum) extends over the top surface of semiconductor region 102 and forms the anode electrode. Conductor 104 forms Schottky contacts with semiconductor region 102 along the mesa surfaces. Conductor 104 is in direct contact with doped liner 110. Conductor 104 may include a barrier metal layer that is suitable for forming a Schottky barrier contact with the mesa surfaces. Another conductor (not shown) extends along the bottom surface of substrate 100 and forms the cathode electrode.

FIGS. 2A-2F show cross-section views at various steps of a process for forming a TMBS rectifier with PN junction clamps, in accordance with an embodiment of the invention. The following description of the steps in the process flow is only exemplary. It should be understood that the scope of the invention is not to be limited to these particular examples.

Figure 2A:
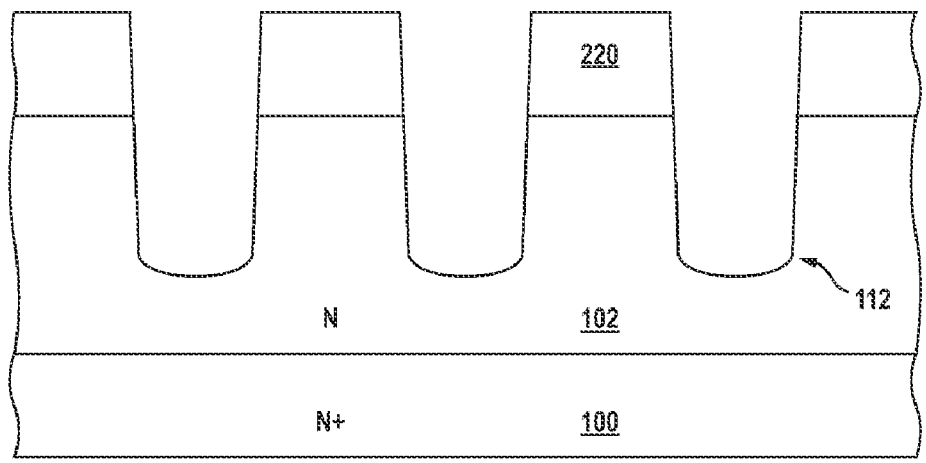
FIGS. 2A-2F show simplified cross-section views at various steps of a process for forming a TMBS rectifier with PN junction clamps, in accordance with an embodiment of the invention.

In FIG. 2A, trenches 112 are formed in semiconductor region 102. Trenches 112 may be formed using hard mask layer 220 according to known techniques. In one embodiment, hard mask layer 220 comprises oxide, semiconductor region 102 comprises a lightly doped N-type epitaxial layer formed over a highly doped N-type substrate 100, and trenches 112 terminate in the epitaxial layer. In another embodiment, trenches 112 extend into and terminate in substrate 100.

Figure 2B:
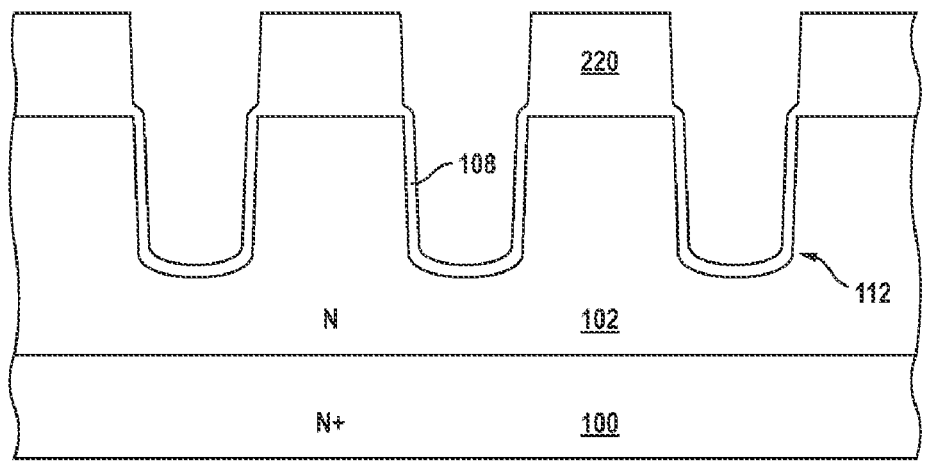
Figure 2C:
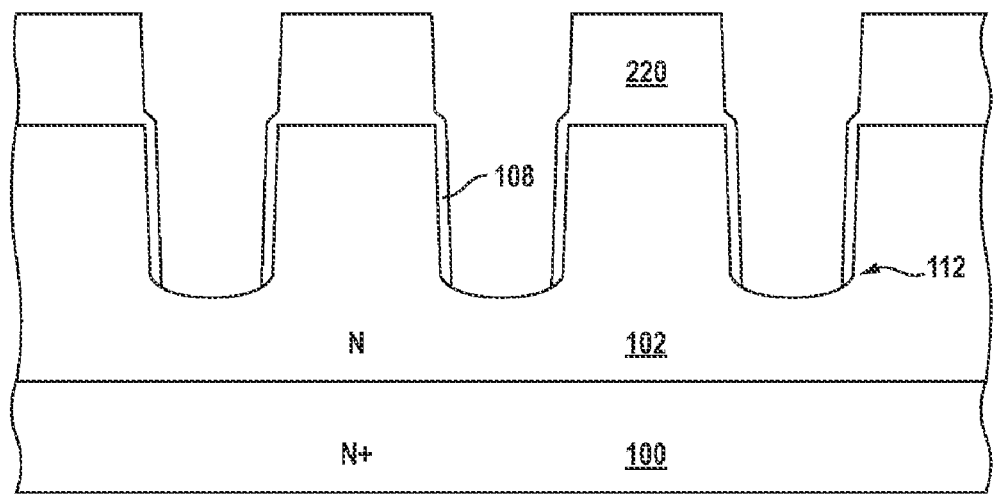

In FIG. 2B, dielectric layer 108 is formed along the sidewalls and bottom of each trench 112 using conventional methods. In one embodiment, dielectric layer 108 comprises a thermal oxide having a thickness in the range of 300-700 Å. In FIG. 2C, dielectric layer 108 is removed along the bottom of each trench 112. In one embodiment, dielectric layer 108 is removed using an anisotropic etch process according to known techniques. The anisotropic etch process removes dielectric layer 108 from along the bottom of each trench 112 without removing the portions of dielectric layer 108 along the sidewalls. However, the thickness of dielectric layer 108 along the sidewalls may be reduced by the anisotropic etch process, which may be accounted for by forming a thicker dielectric layer 108.

In another embodiment, a spacer layer (not shown) may be deposited over dielectric layer 108 prior to the anisotropic etch process. In this embodiment, the anisotropic etch process removes the spacer layer along the bottom of each trench 112 to expose dielectric layer 108 along the bottom of each trench. Portions of the spacer layer remain over dielectric layer 108 along the sidewalls of each trench 112. The exposed portion of dielectric layer 108 along the bottom of each trench 112 can be removed while the portions of dielectric layer 108 along the sidewalls are protected by the remaining portions of the spacer layer. The portions of the spacer layer remaining along the trench sidewalls may be removed prior to the next process step depicted in FIG. 2D, or may be left intact for the remainder of the process. In one embodiment, the spacer layer comprises nitride and dielectric layer 108 comprises oxide.

Figure 2D:
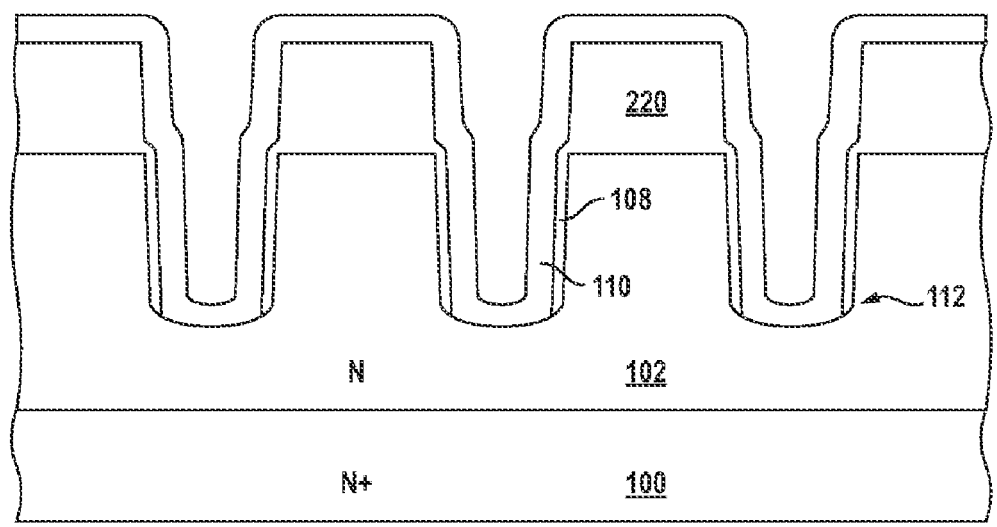

In FIG. 2D, doped liner 110 is formed over dielectric layer 108 and along the bottom of each trench 112 using conventional methods. Doped liner 110 may also extend over hard mask layer 220. An oxide etch process may be used prior to forming doped liner 110 to remove any remaining portions of dielectric layer 108 along the bottom of each trench 112 and/or to remove native oxide along the bottom of each trench 112. In one embodiment, doped liner 110 comprises polysilicon and has a thickness in the range of 700-1300 Å.

Doped liner 110 may be doped in-situ or by implant. The dopants are of an opposite conductivity type than semiconductor region 102. When doped by implant, the dopants are implanted primarily into the portions of doped liner 110 extending horizontally over hard mask layer 220 and along the bottom of each trench 112. Thus, the portions of doped liner 110 extending over hard mask layer 220 and along the bottom of each trench 112 are implanted more heavily than the portions of doped liner 110 extending over dielectric layer 108 along the sidewalls of each trench 112. In one embodiment, doped liner 110 may be doped using an implant comprising $BF_2$ at a dose around $2 \times 10^{15}$ atoms/cm$^2$ and an energy between about 15-25 keV using conventional methods. Hard mask layer 220 prevents the dopants from being implanted into the mesa regions of semiconductor region 102. When doped liner 110 is doped in-situ, hard mask layer 220 may or may not be removed prior to the formation of doped liner 110.

Figure 2E:
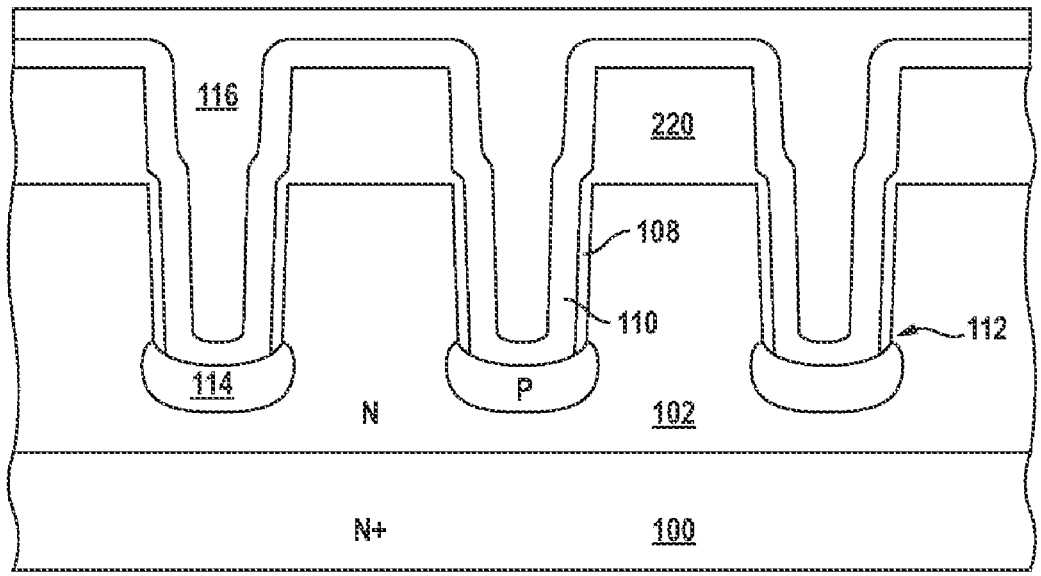

In FIG. 2E, fill material 116 is formed to fill the interior portion of each trench 112 using conventional methods. In one embodiment, fill material 116 comprises polysilicon and has a thickness sufficient to fill the interior portion of each trench 112. Like doped liner 110, fill material 116 may be doped in-situ or by implant. Fill material 116 may be doped to reduce or prevent the diffusion of dopants from doped liner 110 into fill material 116 so that doped liner 110 retains a sufficient amount of dopants for forming silicon region 114 under each trench 112. Fill material 116 may also be doped to reduce series resistance to avalanche current flow under reverse breakdown. In one embodiment, fill material 116 may be doped using an implant comprising boron at a dose around $5 \times 10^{15}$ atoms/cm$^2$ using conventional methods. Hard mask layer 220 prevents the dopants from being implanted into the mesa regions of semiconductor region 102.

In one embodiment, one or more thermal cycles following the deposition of fill material 116 diffuse the dopants from doped liner 110 into semiconductor region 102 along the bottom of each trench 112. Dielectric layer 108 prevents the dopants from diffusing into the semiconductor region along the sidewalls of each trench 112. The dopants that diffuse into semiconductor region 102 along the bottom of each trench 112 form silicon regions 114. In one embodiment, the one or more thermal cycles include a polysilicon anneal process carried out at a temperature of between 800-1050° C. for 80-100 minutes. In embodiments where doped liner 110 and/or fill material 116 comprise polysilicon, the polysilicon anneal process may anneal the deposited polysilicon and diffuse dopants from doped liner 110 into semiconductor region 102.

In other embodiments, the dopants may be diffused into the semiconductor region by thermal cycles that occur before, during, and/or after the formation of fill material 116. In general, dopants diffuse farther into the semiconductor region with each thermal cycle. As one of ordinary skill in the art would know and appreciate, the lateral diffusion of the dopants in semiconductor region 102 will depend on the thermal budget of the processing steps following formation of doped liner 110. However, the techniques according to the present invention advantageously enable minimizing the lateral diffusion of dopants thus allowing the cell pitch to be reduced.

In an alternative embodiment, a doped material is formed over dielectric layer 108 and along the bottom of each trench 112 to fill the entire trench. In this embodiment, doped liner 110 and fill material 116 are replaced by the single layer of doped material. The doped material may comprise polysilicon that is doped in-situ. Here, the doped material is the dopant source for the formation of silicon region 114.

Figure 2F:
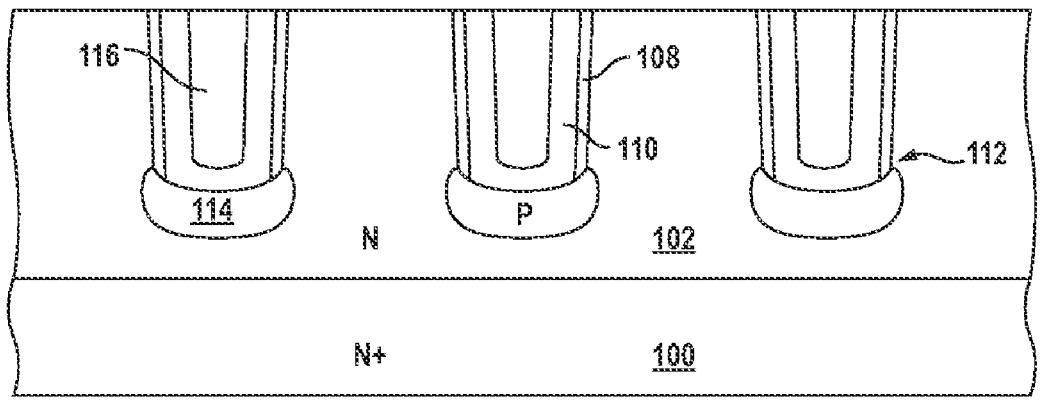

In FIG. 2F, hard mask layer 220 as well as portions of fill material 116 and doped liner 110 that extend above the top surface of semiconductor region 102 are removed from the mesa surfaces using conventional methods. In one embodiment, the layers are removed using one or more conventional chemical mechanical polishing (CMP) processes according to known techniques. The portions of doped liner 110 and fill material 116 remaining in each trench may be recessed slightly below the top surface of semiconductor region 102.

With the formation of the PN junction between silicon regions 114 and semiconductor region 102, the remaining portions of the TMBS rectifier structure shown in FIG. 1 can be formed using any one of a number of known techniques. For example, the mesa regions of semiconductor region 102 may be doped according to known techniques to obtain a desired Schottky barrier height. Conductor 104 may be formed over the structure using conventional methods to form the anode electrode. In one embodiment, conductor 104 comprises aluminum. Schottky rectifying contacts are formed along the mesa surfaces where conductor 104 contacts semiconductor region 102. Conductor 104 is in electrical contact with each PN junction through doped liner 110 and/or fill material 116. In some embodiments, conductor 104 may include a barrier metal layer that is suitable for forming a Schottky barrier contact with the mesa surfaces. Another conductor (not shown) extends along the bottom surface of substrate 100 and forms the cathode electrode.

Schottky rectifiers formed according to embodiments of the invention enjoy, among other advantages and features, a small cell pitch (by minimizing lateral diffusion of silicon regions 114), increased energy handling capability (by distributing avalanche current more uniformly throughout the active area of the structure through the trench rather than the Schottky barrier), improved dielectric breakdown characteristics (by eliminating the high electric field present along trench bottom corners where the dielectric layer extended along the bottom of the trenches), and low reverse leakage. Further, the embodiments of the invention described herein are advantageously simple to implement thus enabling them to be easily integrated with conventional processes for forming devices that include a TMBS rectifier.

Two such devices are trench gate SynchFETs and shielded gate SynchFETs. These are devices where FETs are monolithically integrated with Schottky rectifiers. In such devices, trenches 112 can be formed at the same time the gate trenches are formed for the FET structures, and dielectric layer 108 can be formed at the same time the gate dielectric layer is formed for the FET structures. Also, where fill material 116 comprises polysilicon, filling the interiors of trenches 112 can be carried out at the same time the gate electrodes are formed in the FET structures. Cross section views of an exemplary trench gate SynchFET and an exemplary shielded gate SynchFET are respectively shown in FIGS. 3 and 4.

Figure 3:
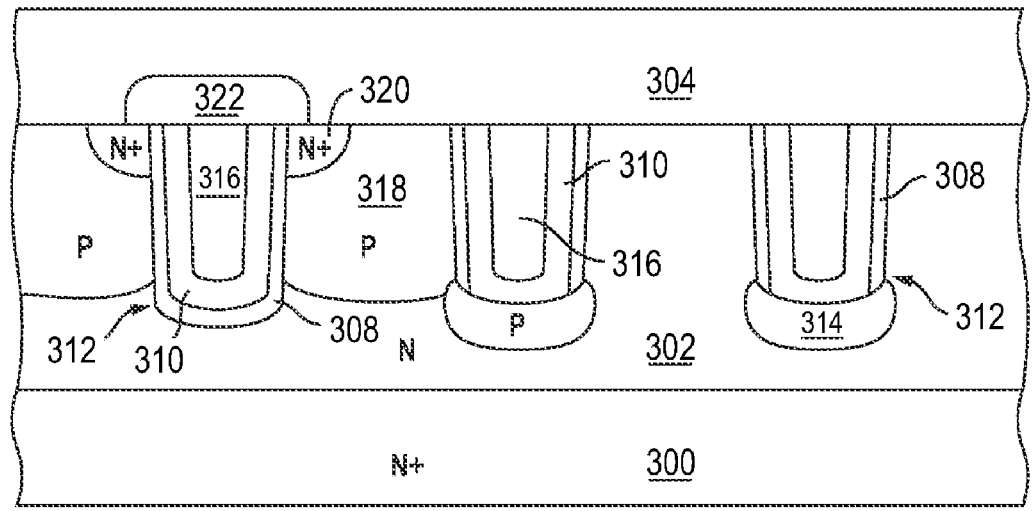
FIG. 3 shows a simplified cross-section view of a monolithically integrated trench-gate MOSFET and TMBS rectifier structure with PN junction clamps, in accordance with another embodiment of the invention.

In FIG. 3, a merged trench gate FET (left side of the figure) and Schottky (right side of the figure) is shown. The trench structure in the FET and Schottky regions are similar except that liner 310 in the FET region is insulated from semiconductor region 302 along the trench bottom. Also, no clamp region 314 is formed under the FET trenches since liner 310 in the FET trenches does not come in contact with semiconductor region 302. Further, liner 310 and fill material 316 in the FET trenches form the gate electrode and are insulated from source/anode interconnect 304 by dielectric cap 322. Liner 310 and fill material 316 in the FET region are instead connected to a gate interconnect (not shown). Additionally, body regions 318 and source regions 320 are formed adjacent only the FET trenches and not the Schottky trenches.

The process sequence depicted by FIGS. 2A-2F may be modified as follows in order to form the SynchFET shown in FIG. 3. After forming dielectric layer 308 in both the FET and Schottky regions, the FET region may be covered by a mask during removal of the portion of dielectric layer 308 extending along the bottom of the Schottky trenches. These steps may be performed using, for example, conventional masking and anisotropic etching techniques. Further, body regions 318, source regions 320, and dielectric cap 322 may be formed in the FET region using conventional techniques. Conventional masking techniques may be used to prevent formation of these regions in the Schottky region. In an alternate embodiment, the gate electrode in the FET region is formed using conventional polysilicon deposition and recessing, carried out separately from the steps for forming liner 310 and fill material 316 in the Schottky region. In yet another embodiment, the FET trenches are filled with fill material 316 without first forming liner 310 along sidewalls of the FET trenches, using known masking techniques. Also, the dielectric layer along the trench bottom in the FET region can be made thicker than the gate dielectric lining the trench sidewalls to minimize gate to drain capacitance. Further, the one or more conductive material forming the gate electrode in the FET trenches may be recessed in the FET trenches if necessary.

Figure 4:
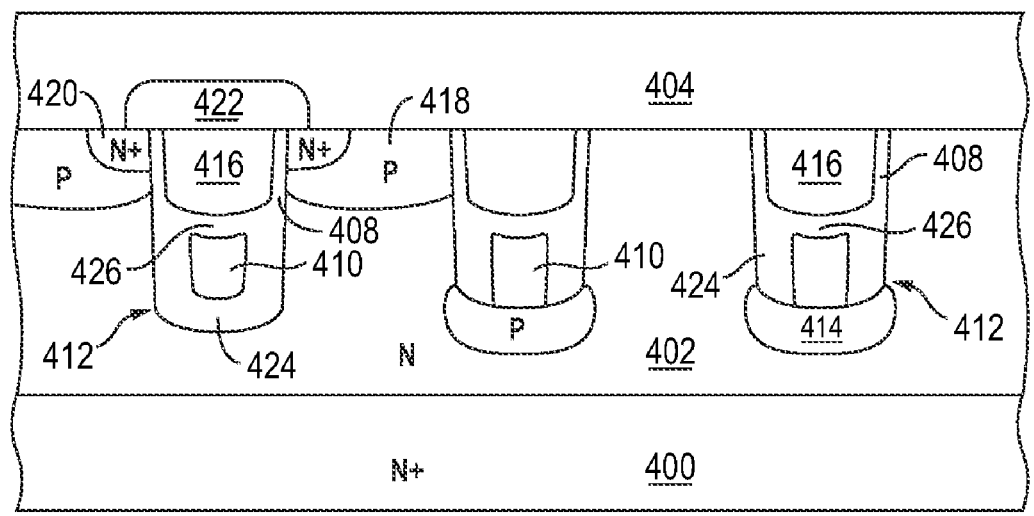
FIG. 4 shows a simplified cross-section view of a monolithically integrated shielded gate trench MOSFET and shielded TMBS rectifier structure with PN junction clamps, in accordance with another embodiment of the invention.

In FIG. 4, a merged shielded gate FET (left side of the figure) and Schottky (right side of the figure) is shown. The trench structure in the FET and Schottky regions are similar except shield electrode 410 in the FET region is insulated from semiconductor region 402 along the trench bottom. Also, no clamp region 414 is formed under the FET trenches since the doped shield electrode 410 (which also functions similar to the doped liner of the prior embodiments) in the FET trenches does not come in contact with semiconductor region 402. Note that while gate electrodes 416 in the Schottky trenches come in direct contact with source/anode interconnect 404, gate electrodes 416 in the FET trenches are insulated from source/anode interconnect 404 by dielectric cap 422. Gate electrodes 416 in the FET region are instead connected to a gate interconnect (not shown). Additionally, body regions 418 and source regions 420 are formed adjacent only the FET trenches and not the Schottky trenches.

While the shield and gate electrodes are shown to be insulated from each other by an inter-electrode dielectric (IED) 426 in both the FET and Schottky trenches, the shield and gate electrodes in the Schottky region need to be electrically connected together to ensure that a current path is provided between clamp region 414 and source/anode interconnect 404. This can be achieved in a number of different ways described further below. Thus, as can be seen, shield electrode 410 in the Schottky trenches functions similar to the doped liners in prior embodiments in providing the source dopants for forming the clamp regions, and gate electrode 416 in the Schottky trenches provides a low resistance path between clamp regions 414 and source/anode interconnect layer 404.

Conventional process techniques for forming shielded gate trench FETs may be modified as described next to form the shielded gate SynchFET shown in FIG. 4. After forming trenches 412 in semiconductor region 402, shield dielectric 424 extending along lower sidewalls and bottom of the FET trenches and along lower sidewalls but not the bottom of the Schottky trenches is formed using known masking techniques. Thus, shield dielectric 424 is continuous along the lower sidewalls and bottom of the FET trenches, but is discontinuous along the bottom of the Schottky trenches. Doped shield electrodes (e.g., P-doped polysilicon) are then formed in lower trench portions using conventional methods. With shield dielectric 424 being discontinuous along the bottom of the Schottky trenches, shield electrodes 410 in the Schottky trenches come in direct contact with semiconductor region 402. Clamp region 414 may then be formed in the semiconductor region 402 under the Schottky trenches by out-diffusing the shield electrode dopants into semiconductor region 402 using a temperature cycle. The temperature cycle may be carried out either independently of other necessary temperature cycles in the overall process, or the out-diffusion may be obtained by relying on temperature cycles carried out in later steps of the process.

Next, inter-electrode dielectric layer 426 is formed over shield electrodes 410 in each trench. In the embodiment where the shield and gate electrodes need to be electrically connected together in the Schottky region but not in the FET region, the shield and gate electrodes in the Schottky trenches are extended up to the surface and brought into contact with one another along a third dimension (e.g., the dimension into the page). Another possibility is to form an opening in IED 426 of only the Schottky trenches and then form a contact between the two electrodes through the opening. Still another possibility is, in forming IED 426, the Schottky trenches may be masked so that IED 426 is not formed in the Schottky trenches, thus allowing the gate and shield electrodes in the Schottky trenches to come in direct contact with one another. Conventional masking techniques may be used to make sure that the shield and gate electrodes in the Schottky region contact one another but not in the FET region. However, in embodiments where it is desirable to bias the shield electrode of the FET to the gate potential (rather than to source potential), no mask is needed in forming the contact between the gate and shield electrodes. Body regions 418, source regions 420, and dielectric cap 422 may be formed only in the FET region using conventional techniques. Note that gate electrodes 416 in the FET trenches can be recessed if desired.

Although a number of specific embodiments are shown and described herein, embodiments of the invention are not limited thereto. For example, in accordance with embodiments of the present invention, doped liner 110 may comprise silicon and be formed by an epitaxial deposition process or a selective epitaxial deposition process (SEG). The epitaxial layer may be doped in-site or by implant. Alternatively, doped liner 110 may comprise a conductive material other than silicon with dopants that can be diffused into the semiconductor region. In yet other embodiments, doped liner 110 may comprise a doped dielectric layer that is removed following the diffusion of the dopants into semiconductor region 102 so that electrical contact can be made between conductor 104 and silicon region 114. Additionally, fill material 116 may comprise a conductive or a nonconductive material. For example, fill material 116 may comprise a metal or a dielectric. In some embodiments, a layer comprising oxide may separate doped liner 110 from fill material 116. In general, regardless of how silicon region 114 is formed, provisions need to be made to ensure electrical contact between conductor 104 and silicon region 114 so that the avalanche current can flow through the trench in the event of an avalanche breakdown.

Also, while the invention is described in context of structures that include a TMBS rectifier, the invention is not limited as such. The technique of using a doped liner to serve as a dopant source for forming a PN junction directly below each trench may be used in other rectifiers or other types of semiconductor structures and devices that could benefit from formation of such PN junctions along trench bottoms.

It is understood that the doping polarities of the structures shown and described could be reversed and/or the doping concentrations of the various elements could be altered without departing from the invention. Also, while the various embodiments described above are implemented in conventional silicon, these embodiments and their obvious variants can also be implemented in silicon carbide, gallium arsenide, gallium nitride, diamond, or other semiconductor materials. Further, the features of one or more embodiments of the invention may be combined with one or more features of other embodiments of the invention without departing from the scope of the invention.

Therefore, the scope of the present invention should be determined not with reference to the above description but should, instead, be determined with reference to the appended claims, along with their full scope of equivalents.

What is claimed is:

1. A structure that includes a rectifier, the structure comprising:
    a semiconductor region of a first conductivity type;
    trenches extending into the semiconductor region;
    a dielectric layer lining opposing sidewalls of each trench but being discontinuous along a bottom of each trench;
    a silicon region of a second conductivity type extending along the bottom of each trench and forming a PN junction with the semiconductor region, wherein the second conductivity type is opposite the first conductivity type;
    a doped liner lining the bottom of each trench and vertically lining at least a portion of the dielectric layer, the doped liner being in direct contact with the silicon region;
    a fill material filling each trench; and
    an interconnect layer extending over the semiconductor region and being in direct contact with the doped liner, wherein the interconnect layer contacts mesa surfaces of the semiconductor region between adjacent trenches to form Schottky contacts therebetween.

2. The structure of claim 1 further comprising an oxide layer separating the doped liner from the fill material.

3. The structure of claim 1 wherein the doped liner comprises epitaxially grown silicon.

4. The structure of claim 1 wherein the doped liner comprises polysilicon.

5. The structure of claim 1 wherein the fill material comprises polysilicon.

6. The structure of claim 1 wherein the semiconductor region includes an epitaxial layer extending over a substrate, the substrate having a higher doping concentration than the epitaxial layer.

7. The structure of claim 6 wherein the trenches extend into and terminate within the epitaxial layer.

8. The structure of claim 6 wherein the trenches extend through the epitaxial layer and terminate within the substrate.

9. The structure of claim 1 wherein the rectifier includes one or more Schottky regions, and the structure further includes one or more FET regions, wherein in the one or more FET regions the dielectric layer lines the opposing sidewalls and the bottom of each trench, and the doped liner lines the dielectric layer, the doped liner being isolated from the semiconductor region by the dielectric layer.

10. The structure of claim 9 further comprising:
in the one or more FET regions:
a body region of the second conductivity type in the semiconductor region; and
source regions of the first conductivity type in the body region adjacent each trench, wherein in the one or more FET regions the interconnect layer contacts the source regions and is isolated from the doped liner by a dielectric cap.

* * * * *